US011307882B1

(12) United States Patent
Zidenberg et al.

(10) Patent No.: US 11,307,882 B1
(45) Date of Patent: Apr. 19, 2022

(54) PERFORMANCE CHECKPOINTING

(71) Applicant: Amazon Technologies, Inc., Seattle, WA (US)

(72) Inventors: Tzachi Zidenberg, Kfar Hasidim (IL); Ali Ghassan Saidi, Austin, TX (US); Leonid Koilis, Haifa (IL); Noam Bashari, Shaar Haamakim (IL)

(73) Assignee: Amazon Technologies, Inc., Seattle, WA (US)

( * ) Notice: Subject to any disclaimer, the term of this patent is extended or adjusted under 35 U.S.C. 154(b) by 50 days.

(21) Appl. No.: 16/584,765

(22) Filed: Sep. 26, 2019

(51) Int. Cl.
  *G06F 17/40* (2006.01)
  *G06F 9/455* (2018.01)

(52) U.S. Cl.
  CPC ...... *G06F 9/45508* (2013.01); *G06F 9/45558* (2013.01); *G06F 2009/45562* (2013.01); *G06F 2009/45575* (2013.01); *G06F 2009/45587* (2013.01); *G06F 2009/45591* (2013.01)

(58) Field of Classification Search
  CPC ............. G06F 9/45508; G06F 9/45558; G06F 2009/45562; G06F 2009/45575; G06F 2009/45587; G06F 2009/45591
  See application file for complete search history.

(56) References Cited

U.S. PATENT DOCUMENTS

| | | | | |
|---|---|---|---|---|
| 2011/0145795 | A1* | 6/2011 | Khanapurkar | G06F 11/3466 717/126 |
| 2014/0095821 | A1* | 4/2014 | Yang | G06F 11/1407 711/162 |
| 2014/0107995 | A1* | 4/2014 | Kostick | G06F 30/20 703/13 |
| 2015/0317491 | A1* | 11/2015 | Yang | G06F 21/53 726/26 |
| 2017/0329623 | A1* | 11/2017 | Dong | G06F 9/45558 |

OTHER PUBLICATIONS

Feng Ruixin et al "CN109271288A Performance estimating method before processor silicon" (Year: 2019).*
English translationCN109271288A Performance estimating method before processor silicon (Year: 2019).*

* cited by examiner

*Primary Examiner* — Doon Y Chow
*Assistant Examiner* — Abdou K Seye
(74) *Attorney, Agent, or Firm* — Weaver Austin Villeneuve & Sampson LLP

(57) ABSTRACT

Techniques for obtaining the performance of an integrated circuit design are disclosed. One such technique may retrieve, from a data store, a set of snapshots of a virtual machine of a host system taken during execution of a performance test. For each snapshot in the set of snapshots, the snapshot can be loaded onto a virtual machine running on an emulator that is emulating the integrated circuit design. The virtual machine can be executed for a reduced runtime, and the performances measured during execution of the snapshots can be used to derive the performance of the integrated circuit design.

22 Claims, 7 Drawing Sheets

PERFORMANCE CHECKPOINTING

BACKGROUND

To evaluate the speed and performance of integrated circuit devices, benchmark tests can be run on a device to determine how long the device takes to perform certain tasks. Some companies such as Standard Performance Evaluation Corporation (SPEC) provide standardized benchmark test suites for the industry to evaluate performance of hardware components by executing application tasks such as video compression, image processing, etc. Different benchmark tests may require different runtime durations. A typical runtime on actual hardware may range from a few minutes to a few hours.

BRIEF DESCRIPTION OF THE DRAWINGS

Various embodiments in accordance with the present disclosure will be described with reference to the drawings, in which.

DETAILED DESCRIPTION

Although the performance of hardware components can be evaluated efficiently with benchmark tests, evaluating the performance of pre-silicon designs using standard benchmark tests can be time consuming. For example, running a benchmark test on an emulator emulating an integrated circuit design may require 1000 times longer than the actual runtime on real silicon. Hence, a test that may last about 15 minutes on real silicon may require 250 hours or over 10 days to run on an emulator. The lengthy execution time can be exacerbated during the design phase of an integrated circuit device, because the benchmark test may need to be rerun each time a pre-silicon design is revised to implement bug fixes or other incremental modifications before finalizing the design. Thus, running a full benchmark test on an emulator emulating a pre-silicon integrated circuit design can be impractical, especially when a design cycle has to meet stringent timelines.

To reduce the amount of time needed to run a benchmark test for a pre-silicon integrated circuit design, the techniques disclosed herein leverage the ability of virtual machines to easily restore execution from a saved state. A full benchmark test can be run on a virtual machine of a hardware system that contains the actual integrated circuit device, and snapshots of the system state are captured at different times during execution of the benchmark test. When a pre-silicon design of the integrated circuit device becomes available, the performance of the design can be assessed by emulating the design in an emulator, and running snippets of the benchmark test on a virtual machine of the emulator. Each snapshot of the benchmark test taken with the real hardware can be loaded onto the emulator, and performance checkpoints are collected by running each snapshot for a short duration of runtime. The performance of the pre-silicon design can then be extrapolated from the performance checkpoints. Thus, instead of running the full benchmark test on the emulator, only snippets (e.g., portions) of the benchmark test are executed, and significant time savings can be achieved when evaluating the performance of a pre-silicon integrated circuit design.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

Figure 1:
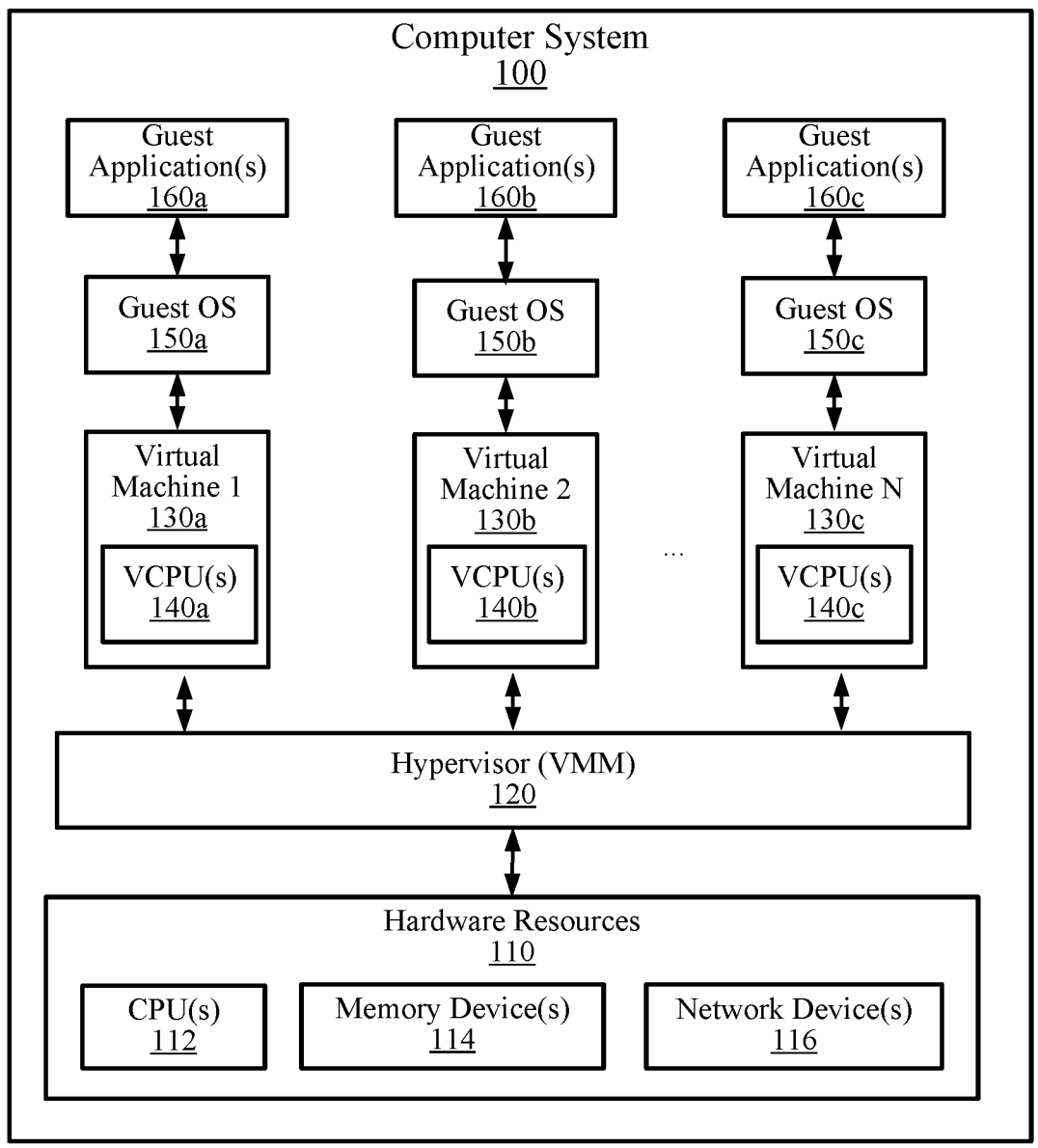
FIG. 1 illustrates an example of a virtualized computer system, according to certain aspects of the disclosure.

FIG. 1 illustrates a block diagram of an example of a virtualized computer system 100, according to certain implementations. Computer system 100 may include hardware resources 110 that may include one or more CPU(s) 112, one or more memory devices 114, one or more network devices 116, or other suitable components. Computer system 100 can be a host system, and may provide a hypervisor 120 executing on hardware resources 110 (e.g., through a host operating system) to manage one or more virtual machines on computer system 100, such as VM 1 (130a), VM 2 (130b), . . . , and VM N (130c).

Hypervisor 120, also referred to as a virtual machine manager (VMM), can support multiple virtual devices on a single physical device in a virtualized environment. Hypervisor 120 can also manage the flow of information between software, the virtualized hardware, and the physical hardware. Hypervisor 120 can be configured to create, start, monitor, stop, or delete each of VMs 1-N (130a-130c), and may execute at a higher privilege level than VMs 1-N (130a-130c). In some implementations, hypervisor 120 can manage access controls, resources, scheduling, isolation, etc., for VMs 1-N (130a-130c) that execute their respective guest operating systems. In some implementations, hypervisor 120 cane be implemented as a software layer or as code embedded in firmware on computer system 100.

Each of VMs 1-N (130a-130c) may act as an independent computer system that is being managed by hypervisor 120. Each of VMs 1-N (130a-130c) can run one or more independent operating systems and one or more applications or processes on hardware resources 110. Two or more VMs from VMs 1-N (130a-130c) may execute simultaneously or in any order on computer system 100. For example, in some instances, at a given time, VMs 1-N (130a-130c) may execute simultaneously on computer system 100. In some instances, VMs 1-N (130a-130c) may execute on computer system 100 one at a time. For example, hypervisor 120 may create and start VM 1 (130a) for a first user. After the user finishes running applications or processes on VM 1 (130a), hypervisor 120 may stop and delete VM 1 (130a), and create and start VM 2 (130b) for a second user, and so on.

Each of VMs 1-N (130a-130c) may be assigned one or more virtual CPUs (VCPUs) 140a, 140b, or 140c. VCPUs are mapped to allocated time slices of available logical processors in the physical computer and can be scheduled by the hypervisor to allow more virtual processors than available logical processors. One or more guest operating systems 150*a*, 150*b*, . . . , or 150*c* may run on the one or more VCPUs 140*a*, 140*b*, . . . , or 140*c* in VM 1 (130*a*), VM 2 (130*b*), . . . , or VM N (130*c*), respectively. One or more guest applications 160*a*, 160*b*, . . . , or 160*c* may in turn run on and managed by the corresponding guest operating systems.

Hardware resources 110 are implemented using actual integrated circuit device components such as microprocessors, memory controllers, semiconductor memories such as DRAMs, network adapter devices such as network interface cards, etc. The performance of any of the integrated circuit devices implemented in actual hardware can be assessed by executing a benchmark test on computer system 100. The benchmark test can be part of a guest application executing on one of the VMs 1-N (130*a*-130*c*), and the benchmark test can be used to measure the amount of time it takes for the computer system 100 to perform certain tasks. For example, a benchmark test may instruct computer system 100 to perform computational intensive tasks such as video compression, and the number of processor cycles needed to execute the instructions to perform the video compression can be used to determine a performance score (e.g., cycles per instruction (CPI)) to indicate how fast the microprocessor of computer system 100 can handle video compression. The runtime of a benchmark test on actual hardware can be relatively short (e.g., a few minutes to a few hours, etc.), and the same benchmark test can be repeated on different computer systems as a way of comparing the relative performance of different versions of an integrated circuit device.

During the design phase of an integrated circuit device, the actual silicon implementing the design is not yet available. As such, to evaluate a pre-silicon integrated circuit design, an emulator can be used to mimic the functionality and timing of the design. However, running a benchmark test on an emulator can take significantly longer than running the test on real silicon (e.g., 1000 times longer). As such, benchmarking a pre-silicon design by running a full benchmark test can be time consuming and impractical.

To reduce the runtime of benchmarking a pre-silicon integrated circuit design on an emulator, the benchmark test is first executed on computer system 100 implementing a version of the integrated circuit device in silicon. In most cases, computer system 100 may contain an older version or generation of the chip being designed. During execution of the benchmark test on the real silicon, snapshots of the system state are taken sequentially at different times during execution of the test. The snapshots can be taken, for example, at a periodic interval, and may include a dump of the system memory (e.g., memory image of the system's DRAM) and the state of the virtual machine (e.g., the values of processor and/or peripheral registers, counters, interrupts, etc.). Each snapshot can be stored with a snapshot identifier to indicate the relative order of the snapshots and which benchmark test the snapshot was taken from. These snapshots of the system state can be used as checkpoints to replay a portion of the benchmark test.

Figure 2:
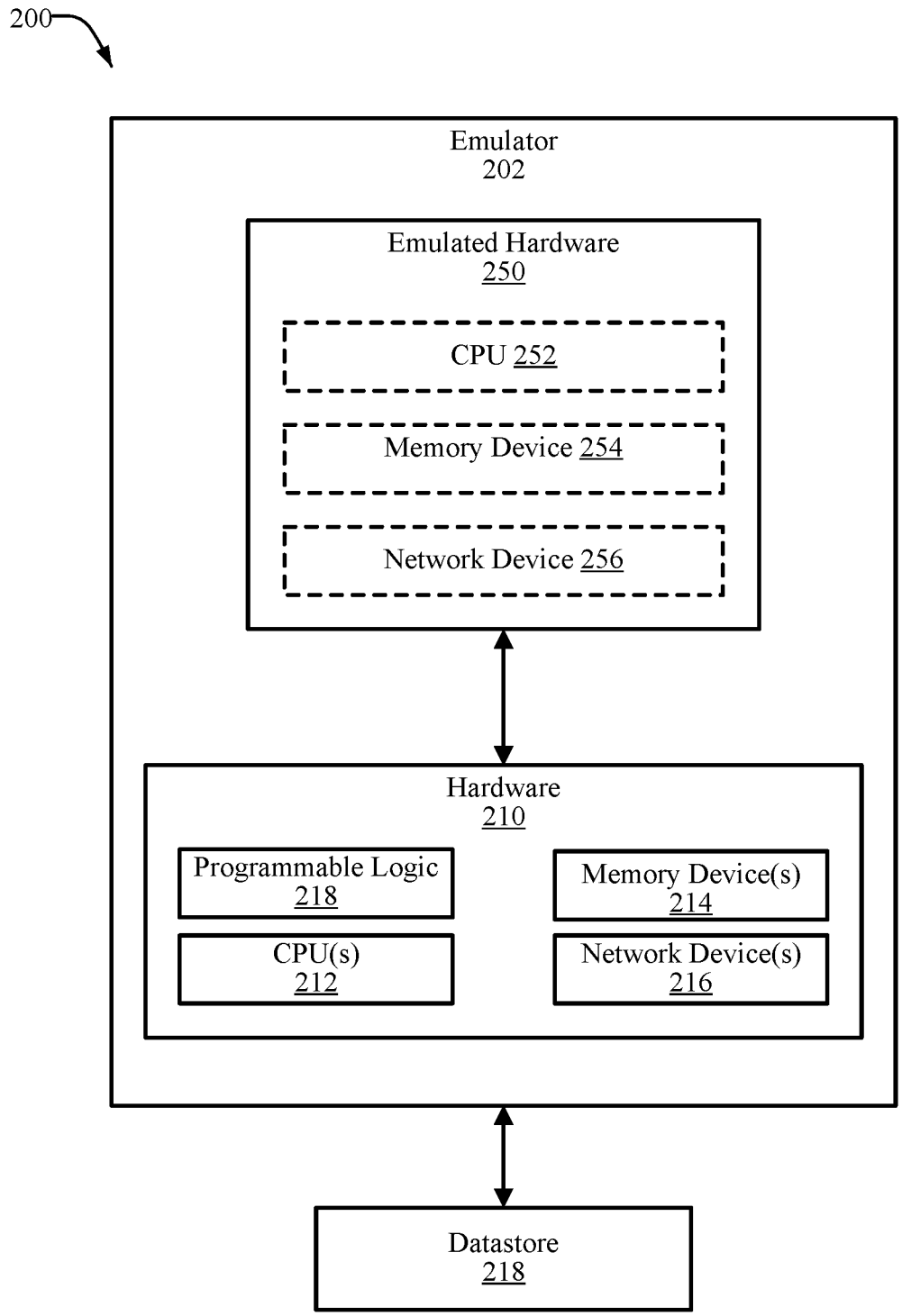
FIG. 2 illustrates an example of an emulator system that can be used to evaluate the performance of a pre-silicon integrated design, according to certain aspects of the disclosure.

FIG. 2 illustrates a block diagram of an example of an emulator system 200 that can be used to evaluate the performance of a pre-silicon integrated circuit design, according to some implementations. Emulator system 200 may include an emulator 202 and a data store 218. Data store 218 can be implemented using one or more storage drives such as solid state, disk, other types of storage medium, or a combination thereof. In some implementations, data store 218 can be integrated as part of emulator 202, or can be located at a remote location. Data store 218 can be used to store, for example, memory image files, virtual machine state files, compiled hardware design files, and/or other information that is used to configure emulator 202.

Emulator 202 may include real hardware 210 such as programmable logic 218, one or more processor(s) 212, memory device(s) 214, and/or network device(s) 216. The components of hardware 210 are actual integrated circuit devices (e.g., real silicon) that can be used to emulate or mimic the functionalities of one or more integrated circuit designs. For example, a hardware design of an integrated circuit device can be loaded onto programmable logic 218 (e.g., field programmable gate array (FPGA), programmable logic (PLD), etc.) to configure programmable logic 218 to behave like the integrated circuit design under test. In some implementations, one or more components of hardware 210 can be omitted, and the functionality of the omitted component can also be emulated by emulator 210.

Emulated hardware 250 may execute emulation software such as QEMU that runs on emulator 202 to mimic one or more integrated circuit devices. For example, emulated hardware 250 may implement one or more of emulated CPU 252, emulated memory device 254, and/or emulated network device 256. Emulated hardware 250 can execute virtual machine monitor functions, and may interact with a kernel and the virtual machine running on emulator 202 to execute a guest OS and/or application(s) 260. Emulated hardware 250 can maintain processor and/or peripheral registers that are found in the actual hardware components. In some implementations, emulated hardware 250 can be used to emulate an integrated circuit design that has yet to be implemented in real silicon. Thus, emulated hardware 250 may provide a mechanism to test and modify new hardware designs.

Emulator 202 may include a kernel implementing a hypervisor running on the emulator 202. The kernel can be a Kernel-based virtual machine (KVM) module functioning as a hypervisor. An example of such can be a Linux KVM. The hypervisor can be used to manage one or more virtual machine(s) running on emulated hardware 250 (which may be referred to herein as emulated virtual machine(s)). For example, the hypervisor may initialize a virtual machine (e.g., by loading a virtual machine state onto the virtual machine), start execution of the virtual machine, monitor the state of the virtual machine, and stop execution of the virtual machine. The hypervisor may run on hardware 210, or on emulated hardware 250.

Running a full benchmark test on emulator 202 to evaluate the performance of a hardware design may take a significantly long time and can be impractical in many situations. Instead of running the full duration of a benchmark test, snapshots of the system state taken at different times during execution of the benchmark test on real silicon can be loaded onto emulator 202, and a snippet of the benchmark test can be run on emulator 202. The performance of the hardware design can be measured for each of the short runs, and be extrapolated to derive a performance score representing the performance of running the full benchmark test on the hardware design. Additional details of the benchmarking techniques are described further with reference to FIGS. 3-4.

Figure 3A:
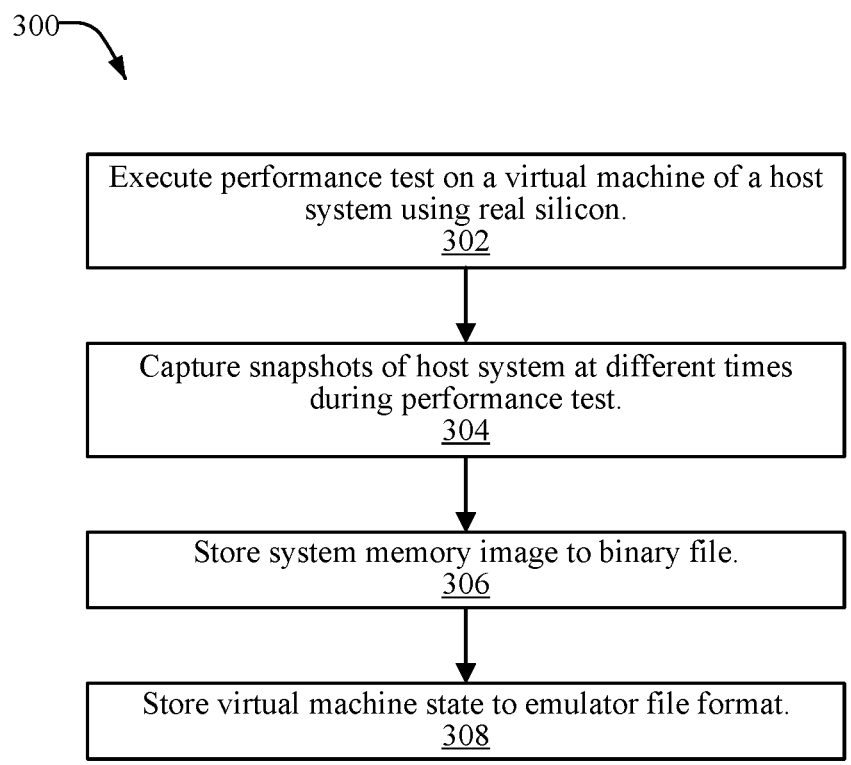
FIG. 3A illustrates an example of a process for taking snapshots of a performance test for execution on an emulator, according to certain aspects of the disclosure.

FIG. 3A illustrates a flow diagram of a process 300 for taking snapshots of a performance test (e.g., benchmark test) for execution on an emulator, according to some implementations. Process 300 is executed on real silicon of an actual host system to determine the state of the system during execution of the performance test. The system state is captured at various times during execution of the performance test to generate a set of snapshots that can be replayed on an emulator to determine the performance of an integrated circuit design of an integrated circuit device being emulated on the emulator. The integrated circuit design can be, for example, a pre-silicon microprocessor design, a pre-silicon memory controller design, a pre-silicon network adapter device design, or a pre-silicon design of a combination of one or more hardware components in a host system.

Process 300 may begin at block 302 by executing a performance test on a virtual machine of a host system. The host system may include a host or system memory (e.g., implemented using DRAM) and real silicon such as an actual microprocessor, memory controller, network adapter device, etc. In other words, the host system running the performance test at this phase of the process uses integrated circuit devices implemented in non-emulated hardware. The real silicon of the host system may include an earlier version of an integrated circuit device that is currently being designed. It can be beneficial to use an earlier version of the same chip under design, because absent a major architectural redesign, the behavior of different generations of the same chip are generally similar.

At block 304, snapshots of the host system state are captured at different times during execution of the performance test on the host system. For example, the snapshots can be taken at periodic time intervals during the performance test. In some implementations, if the performance test has large variations in computational demands throughout the test, the snapshots can be taken more frequently (e.g., once every 200 milliseconds, 500 milliseconds, or 1 second, etc.) to ensure the variations in computational demands are captured in the snapshots, and that the computational demands between each snapshot stays fairly uniform. If the performance test has fairly uniform computational demands, then the snapshots can be taken more infrequently (e.g., once every second, 2 seconds, or 5 seconds, etc.). Each snapshot may include a state of the virtual machine (e.g., including processor register and counter values, peripheral device counters and register values, etc.), and a memory image of the host or system memory (e.g., a DRAM dump) at the time when the snapshot is taken.

For each of the captured snapshots, the memory image can be stored to a binary file at block 306, and the virtual machine state can be stored to an emulator file format such as QEMU copy on write (qcow) format at block 308. Each of these files may include a snapshot identifier (e.g., a sequence number, time stamp, etc.) that can be used to indicate the time and/or order in which the snapshots were taken, as well as a test identifier indicating the corresponding performance test. It should be noted that in some implementations, the memory image of the host or system memory is not stored together with the virtual machine state in the emulator file format, but is instead stored separately as a binary file. Loading a memory image from an emulator file onto an emulator can be time consuming. Storing the memory image separately allows the memory image to be loaded onto an emulator using a separate channel to speed up the process. In some implementations, each virtual machine state can be stored in the emulator image file format as an overlay that represents state changes from a base image or state changes from a preceding overlay of a preceding virtual machine state.

Figure 3B:
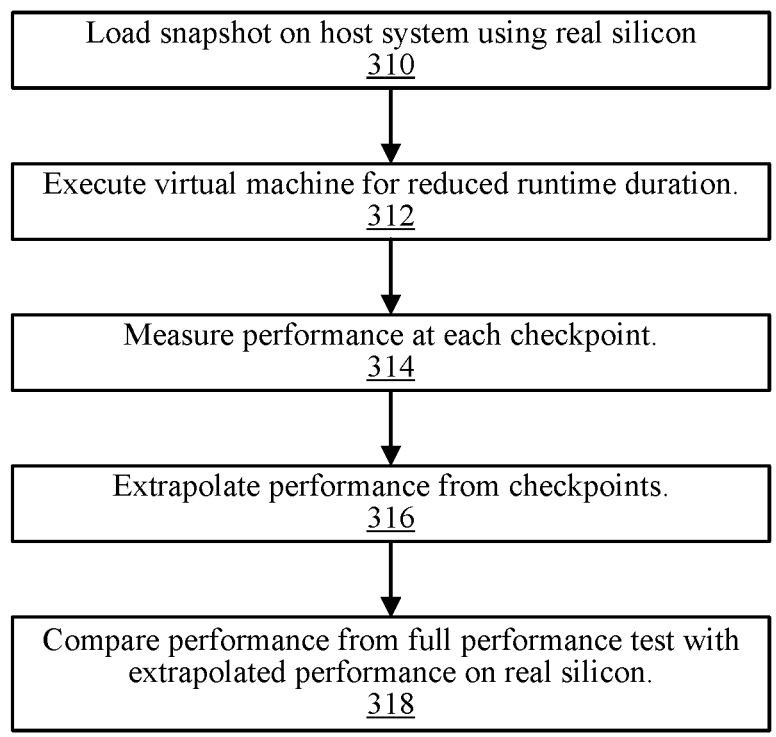
FIG. 3B illustrates an example of a process for evaluating the effectiveness of the snapshots for representing the performance test, according to certain aspects of the disclosure.

After the set of snapshots corresponding to a performance test has been captured and stored, the snapshots can be replayed on the host system with the real hardware to verify that the performance score of running the full performance test on the real hardware corresponds to the performance score extrapolated from running the snapshots on the real hardware. FIG. 3B illustrate the flow diagram of a process 350 for evaluating the snapshots on the real silicon. It should be noted that in some implementations, process 350 can be optional. At block 310, a snapshot including the virtual machine state and the memory image are loaded onto the host system that was used to capture the snapshots. At block 312, the virtual machine of the host system is executed for a reduced or shortened runtime duration to run a snippet of the performance test. For example, if the snapshots were taken at a 1 second interval, each snapshot can be run for 200 msec. of system time. At block 314, the performance of the host system is measured over the reduced or shortened runtime duration, and recorded as a checkpoint performance for the corresponding snapshot. The operations of blocks 310-314 are repeated for each snapshot of the performance test.

Once all snapshots have been replayed on the host system, and the checkpoint performances have been collected, an overall performance score can be derived from the checkpoint performances at block 316. For example, if the checkpoint performances measured performance in terms of cycles per instruction (CPI), the number of cycles per instruction can be assumed to be uniform over the execution phase of the performance test between two snapshots. Thus, if the snapshots are taken 1 second apart, and each snapshot is run for 200 msec, the CPI measured during the 200 msec. runtime of a snapshot can be extrapolated or assumed to be the CPI that would have been measured over the full 1 second. A mean or average can then be calculated over the CPIs measured for the set of snapshots to derive an overall CPI for the performance test. This overall CPI can be used as the overall performance score. For some benchmark tests such as SPEC, the CPI can be compared with a reference CPI, and the ratio of the two can be used as the performance score.

At block 318, the performance score of the host system running the full performance test is compared with the extrapolated performance score from running the snapshots on the same host system. If the two performance scores closely correspond to one another (e.g., within 2%, 1%, or less), then the set of snapshots can be used as an effective substitute for running the full performance test. If the differences between the two performance scores exceed an acceptable threshold, process 300 can be repeated by taking more frequent snapshots.

Figure 4:
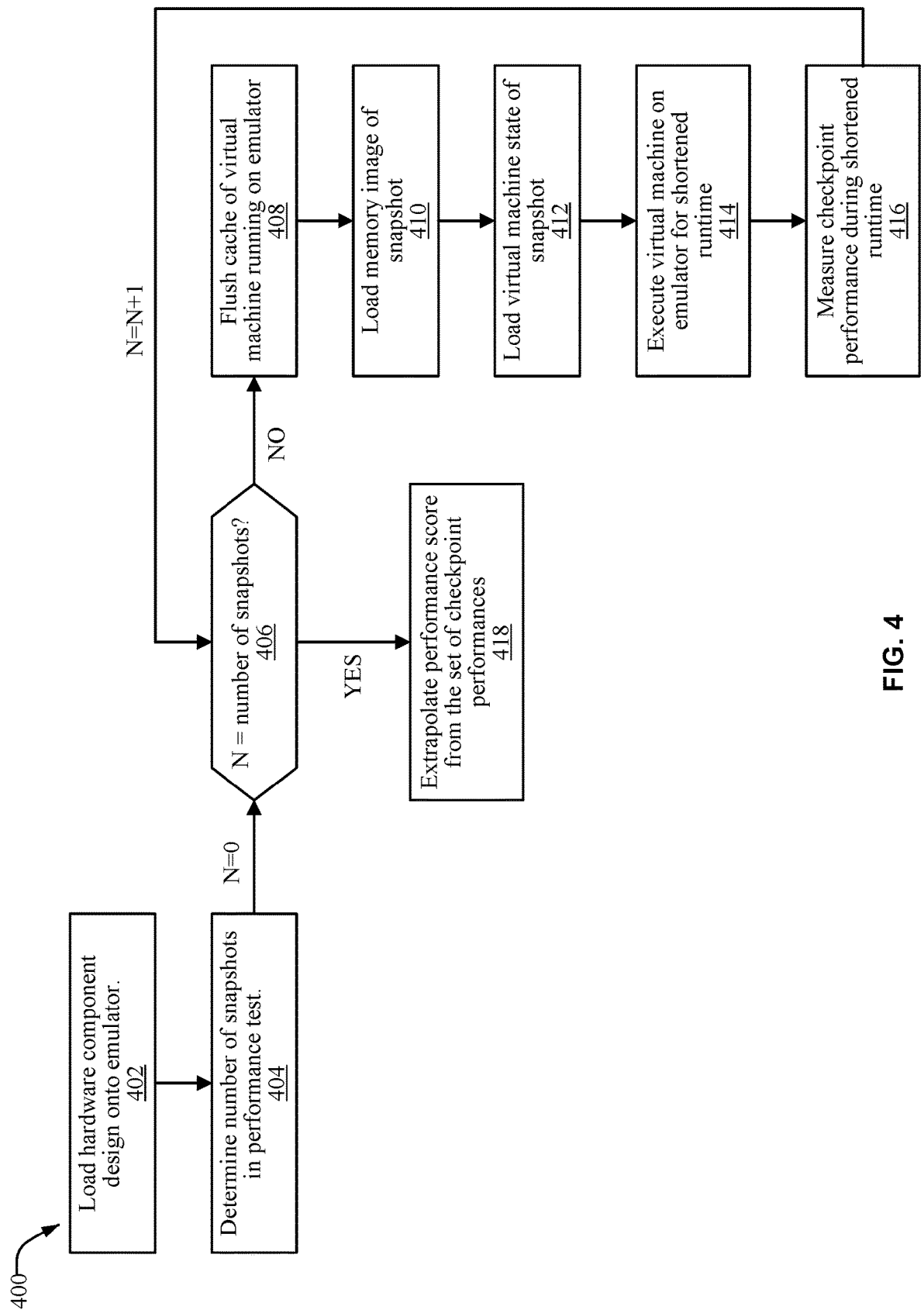
FIG. 4 illustrates an example of a process for determining the performance of a pre-silicon integrated circuit design, according to certain aspects of the disclosure.

FIG. 4 illustrates a flow diagram of a process 400 for determining the performance of a pre-silicon integrated circuit design for a performance test (e.g., benchmark test), according to some implementations. At block 402, the integrated circuit design of a hardware component (e.g., pre-silicon design of a processor, pre-silicon design of a network interface adapter, etc.), can be loaded onto an emulator. In some implementations, the integrated circuit design can be emulated using emulation software executing on an actual processor of the emulator system, programmable logic such as a FPGA or PLD, or a combination of both. The emulator can be used to mimic the behavior of the integrated circuit design.

A performance test (e.g., a benchmark test) can be selected for execution on the emulator to evaluate the performance of the integrated circuit design. The performance test may instruct the emulator system to perform certain tasks such as video compression, image processing, etc., and measure the number of system cycles needed to complete the task. The performance test can be stored at a data store (e.g., hard disk) in the form of a set of snapshots of the system state taken during the execution of the performance test on a host system using real hardware. At block 404, the number of snapshots in the performance test is determined. This number indicates now many snippets will be run for this particular performance test.

At block 406, process 400 determines if the emulator has executed all the snapshots in the performance test. If not, process 400 proceeds to block 408 to flush the cache of the virtual machine running on the emulator. Because loading a snapshot onto the emulator may involve changing the stored values of the system memory used by the emulator, it is possible that the cache of the virtual machine will be inconsistent with the new system memory image. As such, flushing the cache can ensure that each snapshot can be run properly from a clean starting point.

At block 410, a snapshot of the selected performance test is retrieved from the data store, and the system memory image of the snapshot is loaded onto a memory used by the virtual machine of the emulator. The memory can be a memory implemented in actual hardware, or a memory that is being emulated by the emulator. For example, the memory image may correspond to a random access memory image (e.g., DRAM image) that can be loaded onto a DRAM module used by the virtual machine running on the emulator.

In some implementations, in order to reduce the amount of time needed to load the memory image, a hypervisor of the emulator may determine the memory addresses that the emulator has allocated to the virtual machine running on the emulator, and the memory loading operation can be performed for only those of the memory addresses that have been allocated to the virtual machine running on the emulator. In other words, the hypervisor may exclude memory addresses of the memory that are not utilized by the virtual machine running on the emulator when loading the memory image onto the memory. In some implementations, loading the memory image from the snapshot onto the memory of the emulator may require the emulator to emulate memory access cycles, which can be time consuming. To further speed up the memory image loading process, a separate channel that bypasses the virtual machine running on the emulator can be used to copy the contents of the memory image file onto the memory used by the virtual machine running on the emulator.

At block 412, the virtual machine state of the snapshot is loaded onto the virtual machine running on the emulator. This may involve copying processor register values from the snapshot onto the registers of the virtual machine running on the emulator. In some implementations, this may also involve copying peripheral device registers and/or other information from the snapshot, which may be needed by the emulator to restart execution from a restore point.

At block 414, the virtual machine of the emulator is executed for a shortened runtime duration to run a snippet of the performance test from a starting point of the loaded snapshot. The runtime duration is shorter than the time interval of which the snapshots are taken. For example, if the snapshots were taken 1 second apart from one another, the virtual machine on the emulator may run for 200 msec of system runtime after loading each snapshot. It should be understood that running 200 msec of system runtime on an emulator can take much longer in real time, and in some instances may take 1000 times longer. Thus a 200 msec run may take over 3 minutes in real time.

At block 416, the interim performance of the integrated circuit design running on the emulator can be sampled or measured to obtain a performance checkpoint for the snapshot. This may involve counting the number of processor cycles per instruction during the runtime duration of the snapshot, and storing the performance information in a performance register. Process 400 may then return to block 406 to determine if the performance test has another snapshot to load, and the operations in blocks 408-416 can be repeated for each snapshot in the performance test. If all the snapshots of the performance test has been run, process 400 may proceed to block 418.

At block 418, a performance score of the integrated circuit design can be determined based on the sampled or measured performance checkpoint for each of the snapshots loaded onto the emulator. For example, it can be assumed that the performance taken over the shorten runtime duration remains fairly constant for the entire time between snapshots. Thus, the overall performance score as if the full performance test was run can be extrapolated from theses performance checkpoints.

In some implementations, process 400 can be used to compare the performance of a new design against an older generation of the integrated circuit device. A series of benchmark tests can be executed on the old silicon and on the new design, and a performance score of the new design can be determined as:

$$Score_{new} = \frac{Score_{old}}{\frac{1}{n}\sum \frac{(instructions)_{old}/cycles_{old}}{instructions_{new}/cycles_{new}}}$$

where n is the number of benchmark tests, and the summation is of the instructions per cycles determined over the different benchmark tests. The techniques disclosed herein can provide significant time savings when running performance tests on an emulator emulating a hardware design. By utilizing these techniques, a design cycle can be completed in less time, and performance tweaks and fixes can be employed in the pre-silicon stage before manufacturing the semiconductor chip.

Figure 5:
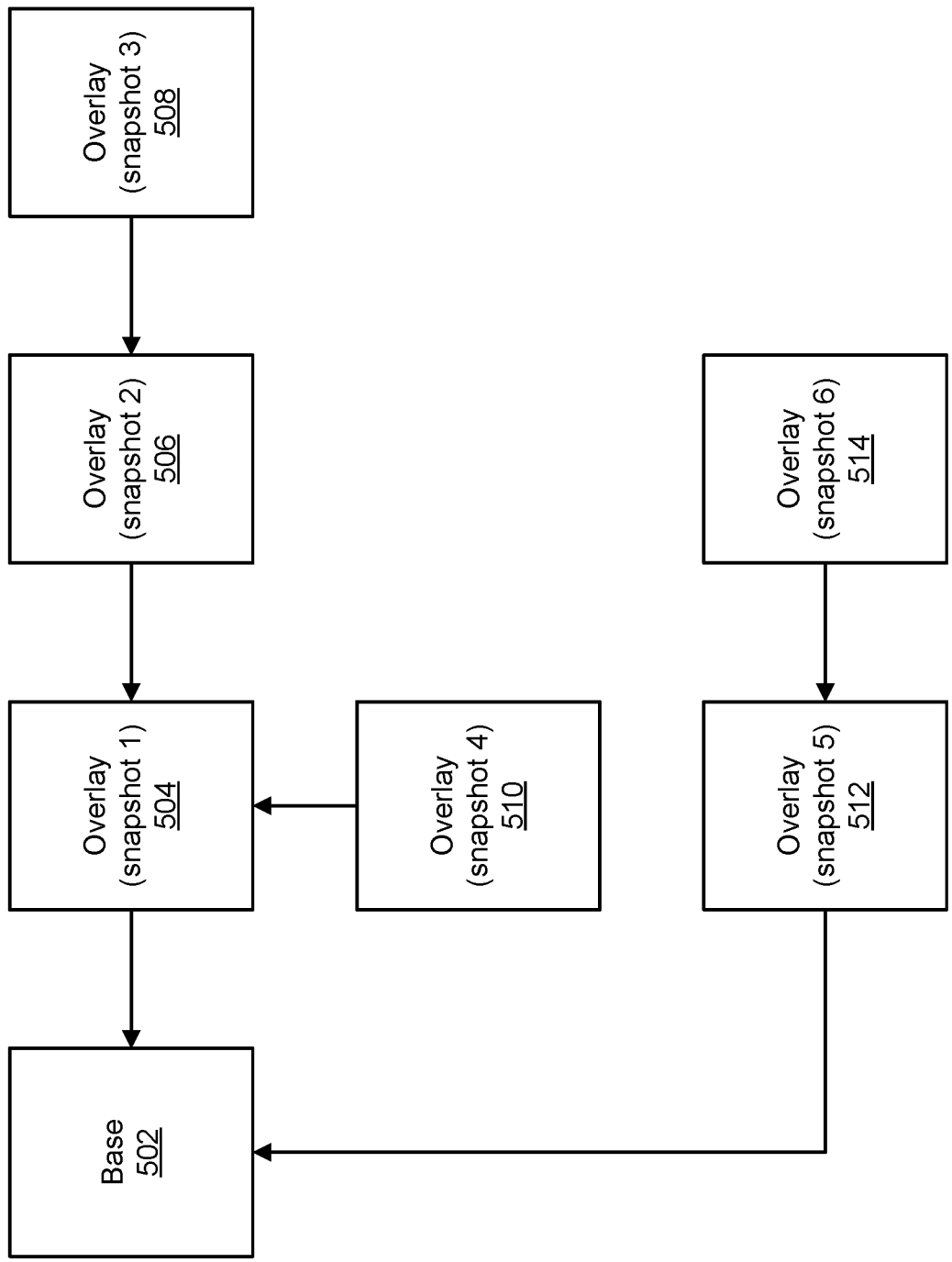
FIG. 5 illustrates an example of an emulator image file structure, according to certain aspects of the disclosure.

FIG. 5 illustrates an example of an emulator image file structure, according to some implementations. The emulator image file structure shown in FIG. 5 includes a base image 502 that includes a baseline configuration and state of a virtual machine. Base image 502 may include information indicating the values of processor registers, peripheral device registers, and other state variables of the system. Overlays 504-514 may each represent a snapshot of the system state at different times. Each overlay may represents state changes from either base image 502, or state changes from a preceding overlay of a preceding virtual machine state.

For example, overlay 504 may correspond to a first snapshot, and overlay 504 may include only state information that has changed from base image 504. Overlay 506 may correspond to a second snapshot, and overlay 506 may include only state information that has changed from overlay 504. Similarly, overlay 508 may correspond to a third snapshot, and overlay 508 may include only state information that has changed from overlay 506.

In some implementations, an overlay need not be dependent on the immediate prior overlay. For example, overlays 510 may correspond to a fourth snapshot, and overlay 510 may include only state information that has changed from overlay 504. Multiple overlays can also depend directly on the base image. For example, overlays 512 may correspond to a fifth snapshot, and overlay 512 may include only state information that has changed from overlay 512. Lastly, overlay 514 may correspond to a sixth snapshot, and overlay 514 may include only state information that has changed from overlay 512. Because each snapshot may contain only state information that has change from a prior overlay or from the base image, the size of the snapshot files can be kept relatively small. This may also reduce the amount of time needed to load the snapshot onto the emulator.

Figure 6:
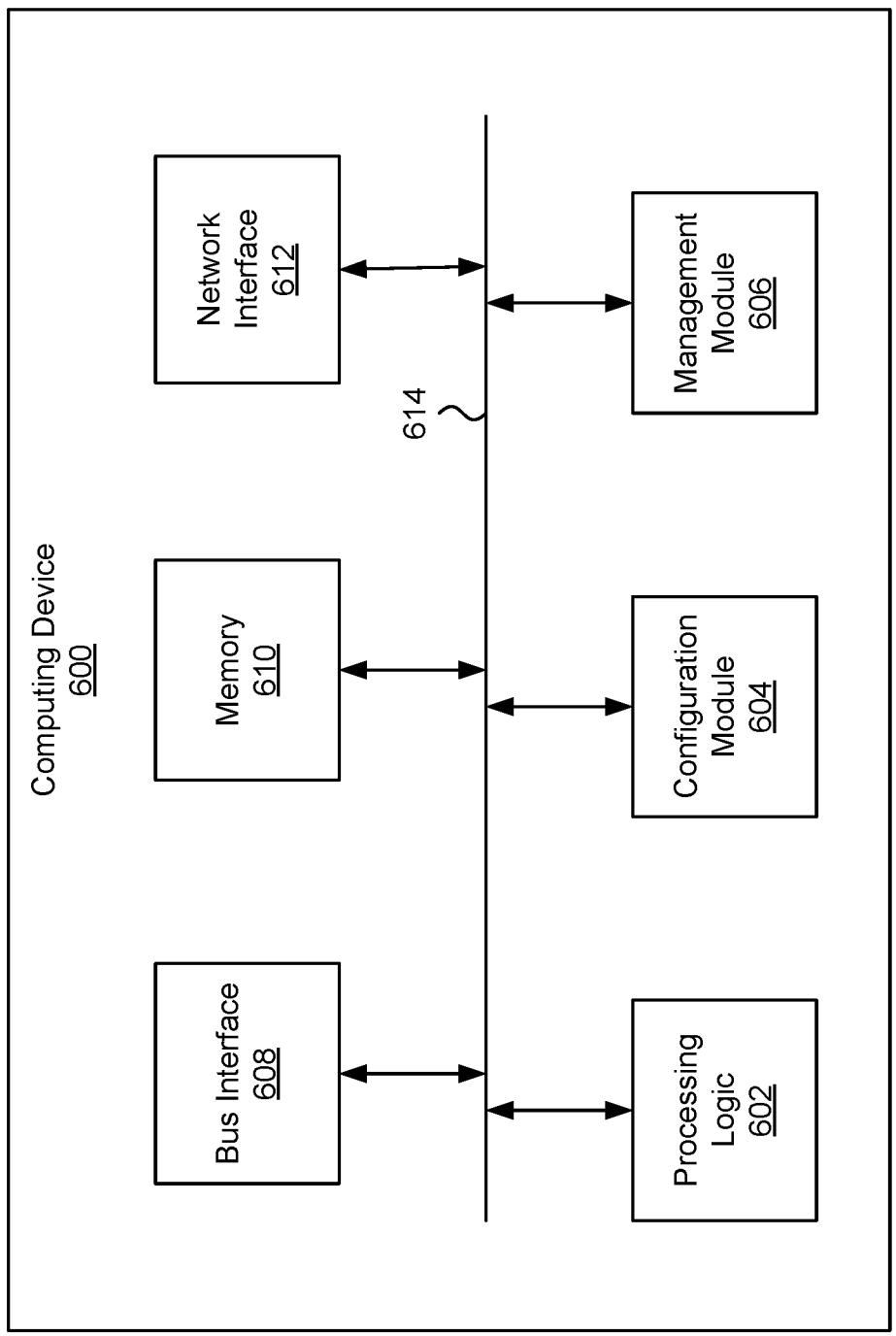
FIG. 6 illustrates an example of a computing device, according to certain aspects of the disclosure.

FIG. 6 illustrates an example of a computing device 600 in which at least some components can be design and tested using the techniques disclosed herein. Functionality and/or several components of the computing device 600 may be used without limitation with other embodiments disclosed elsewhere in this disclosure, without limitations. A computing device 600 may facilitate processing of packets and/or forwarding of packets from the computing device 600 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computing device 600 may be the recipient and/or generator of packets. In some implementations, the computing device 600 may modify the contents of the packet before forwarding the packet to another device. The computing device 600 may be a peripheral device coupled to another computer device, a switch, a router or any other suitable device enabled for receiving and forwarding packets.

In one example, the computing device 600 may include processing logic 602, a configuration module 604, a management module 606, a bus interface module 608, memory 610, and a network interface module 612. These modules may be hardware modules, software modules, or a combination of hardware and software. In certain instances, modules may be interchangeably used with components or engines, without deviating from the scope of the disclosure. The computing device 600 may include additional modules, not illustrated here, such as components discussed with respect to the nodes disclosed in FIG. 7. In some implementations, the computing device 600 may include fewer modules. In some implementations, one or more of the modules may be combined into one module. One or more of the modules may be in communication with each other over a communication channel 614. The communication channel 614 may include one or more busses, meshes, matrices, fabrics, a combination of these communication channels, or some other suitable communication channel.

The processing logic 602 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 602 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 602 may be stored on a computer-readable storage medium, for example, in the form of a computer program. The computer-readable storage medium may be non-transitory. In some cases, the computer-readable medium may be part of the memory 610.

The memory 610 may include either volatile or non-volatile, or both volatile and non-volatile types of memory. The memory 610 may, for example, include random access memory (RAM), read only memory (ROM), Electrically Erasable Programmable Read-Only Memory (EEPROM), flash memory, and/or some other suitable storage media. In some cases, some or all of the memory 610 may be internal to the computing device 600, while in other cases some or all of the memory may be external to the computing device 600. The memory 610 may store an operating system comprising executable instructions that, when executed by the processing logic 602, provides the execution environment for executing instructions providing networking functionality for the computing device 600. The memory may also store and maintain several data structures and routing tables for facilitating the functionality of the computing device 600.

In some implementations, the configuration module 604 may include one or more configuration registers. Configuration registers may control the operations of the network device 600. In some implementations, one or more bits in the configuration register can represent certain capabilities of the computing device 600. Configuration registers may be programmed by instructions executing in the processing logic 602, and/or by an external entity, such as a host device, an operating system executing on a host device, and/or a remote device. The configuration module 604 may further include hardware and/or software that control the operations of the computing device 600.

In some implementations, the management module 606 may be configured to manage different components of the computing device 600. In some cases, the management module 606 may configure one or more bits in one or more configuration registers at power up, to enable or disable certain capabilities of the computing device 600. In certain implementations, the management module 606 may use processing resources from the processing logic 602. In other implementations, the management module 606 may have processing logic similar to the processing logic 602, but segmented away or implemented on a different power plane than the processing logic 602.

The bus interface module 608 may enable communication with external entities, such as a host device and/or other components in a computing system, over an external communication medium. The bus interface module 608 may include a physical interface for connecting to a cable, socket, port, or other connection to the external communication medium. The bus interface module 608 may further include hardware and/or software to manage incoming and outgoing transactions. The bus interface module 608 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 608 may include the physical layer for any of these bus protocols, including a connector, power management, and error handling, among other things. In some implementations, the computing device 600 may include multiple bus interface modules for communicating with multiple external entities. These multiple bus interface modules may implement the same local bus protocol, different local bus protocols, or a combination of the same and different bus protocols.

The network interface module 612 may include hardware and/or software for communicating with a network. This network interface module 612 may, for example, include physical connectors or physical ports for wired connection to a network, and/or antennas for wireless communication to a network. The network interface module 612 may further include hardware and/or software configured to implement a network protocol stack. The network interface module 612 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 600 may include multiple network interface modules, each configured to communicate with a different network. For example, in these implementations, the computing device 600 may include a network interface module for communicating with a wired Ethernet network, a wireless 802.11 network, a cellular network, an Infiniband network, etc.

The various components and modules of the computing device 600, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 6, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computer-implemented method for determining a performance of an integrated circuit design of an integrated circuit device, the method comprising:

executing a performance test for a duration of system time on a virtual machine of a host system, wherein the host system contains a system memory and a version of the integrated circuit device implemented in hardware;

capturing a plurality of snapshots of the host system at different times during the performance test, wherein each snapshot includes a state of the virtual machine and a memory image of the system memory at a time when the snapshot was taken;

executing a virtual machine running on an emulator emulating the integrated circuit design for a shortened duration of system time that is less than the duration of system time;

for each of the snapshots:
flushing a cache of the virtual machine running on the emulator; and
subsequent to flushing the cache, loading the state of the virtual machine onto the virtual machine running on the emulator, and loading the memory image onto a memory used by the emulator;

measuring an interim performance of the integrated circuit design for each of the snapshots loaded onto the emulator to obtain a set of performance checkpoints; and extrapolating the set of performance checkpoints to determine the performance of the integrated circuit design for the performance test.

2. The computer-implemented method of claim 1, further comprising:
determining a set of memory addresses of the memory that the emulator allocated to the virtual machine running on the emulator.

3. The computer-implemented method of claim 2, wherein loading the memory image onto the memory of the emulator is performed by loading only the memory addresses that the emulator allocated to the virtual machine running on the emulator.

4. The computer-implemented method of claim 1, wherein the memory image of each snapshot is loaded onto the memory using a channel that bypasses the virtual machine running on the emulator.

5. A method comprising:
for each of a plurality of snapshots taken during a performance test having a duration of system time:
retrieving a snapshot of a guest running on real silicon, wherein the snapshot includes a virtual machine state and a memory image;
flushing a cache of a virtual machine prior to loading the snapshot;
subsequent to flushing the cache, loading the virtual machine state onto the virtual machine running on an emulator that is emulating a circuit design of a hardware component of a host system and loading the memory image onto a memory used by the emulator; and
executing the virtual machine on the emulator for a shortened duration of system time that is less than the duration of system time to measure a performance of the circuit design for the snapshot; and
extrapolating measured performances for the plurality of snapshots to determine the performance of the circuit design for the performance test.

6. The method of claim 5, further comprising:
measuring a performance of the circuit design for the snapshot loaded onto the emulator; and
comparing the measured performance of the circuit design with a performance of the real silicon.

7. The method of claim 5, wherein the snapshot is part of a set of snapshots taken at a periodic time interval while the guest is running on the real silicon.

8. The method of claim 7, further comprising:
measuring a performance of the circuit design for each of the snapshots loaded onto the emulator; and
determining a performance score of the circuit design based on the measured performance for each of the snapshots loaded onto the emulator.

9. The method of claim 8, wherein the shortened duration of system time is shorter than the periodic time interval.

10. The method of claim 8, wherein measuring the performance of the circuit design includes determining a number of processor cycles per instruction during a runtime duration.

11. The method of claim 8, wherein the performance score is determined by taking an average of the measured performance for each of the snapshots.

12. The method of claim 5, wherein loading the memory image onto the virtual machine running on the emulator includes determining a set of memory addresses allocated to the virtual machine running on the emulator, and loading the memory image of the snapshot onto a memory of the emulator corresponding to the set of memory addresses.

13. The method of claim 5, wherein loading the memory image onto the virtual machine running on the emulator includes bypassing the virtual machine running on the emulator to load the memory image onto a memory of the emulator.

14. The method of claim 5, wherein the virtual machine state includes processor register values.

15. The method of claim 5, wherein the virtual machine state is stored in an emulator image file format, and the memory image is stored separately in a binary file format.

16. The method of claim 15, wherein each virtual machine state is stored in the emulator image file format as an overlay that represents state changes from a base image or state changes from a preceding overlay of a preceding virtual machine state.

17. An emulator system emulating a hardware component design, the emulator system comprising:
a hardware data store configured to store a set of snapshots of a virtual machine of a host system, the snapshots having been taken at a periodic time interval during execution of a performance test having a duration of system time on the host system, and each snapshot including a virtual machine state and a memory image; and
a hypervisor running on emulated hardware and configured to perform, for each snapshot in the set of snapshots, operations including:
retrieving the snapshot from the hardware data store;
flushing a cache of a virtual machine running on the emulator system;
subsequent to flushing the cache, loading the virtual machine state onto the virtual machine running on the emulator system and loading the memory image onto a memory used by the emulator system; and
executing the virtual machine running on the emulator system for a shortened duration of system time that is shorter than the duration of system time to measure a performance of the hardware component design for the snapshot,
wherein a performance of the hardware component design for the performance test is determined by extrapolating measured performances for the set of snapshots.

18. The emulator system of claim 17, wherein the operations further include:
storing performance information indicating a number of processor cycles per instruction executed during a runtime duration.

19. The emulator system of claim 17, wherein loading the snapshot onto the virtual machine running on the emulator system includes loading processor register values from the snapshot into the virtual machine running on the emulator system, and loading a random access memory image from the snapshot into a memory utilized by the virtual machine running on the emulator system.

20. The emulator system of claim 19, wherein the hypervisor excludes memory addresses of the memory that are not utilized by the virtual machine running on the emulator system when loading the random access memory image onto the memory.

21. The emulator system of claim 19, wherein the memory is an emulated memory.

22. The emulator system of claim 17, wherein each snapshot includes a binary file representing a memory image of a system memory of the host system, and an emulator image file representing a virtual machine state.

* * * * *